United States Patent [19]

Burkhardt et al.

[11] Patent Number: 5,106,658
[45] Date of Patent: Apr. 21, 1992

[54] HARDNESS IMPROVEMENT OF FILM CONTAINING ARYLSILOXANE AND ORGANOSILICATE

[75] Inventors: Eric W. Burkhardt, Brewster; Klara Kiss, Yonkers; John H. Deatcher, Lake Peekskill, all of N.Y.

[73] Assignee: Akzo NV, Arnhem, Netherlands

[21] Appl. No.: 660,472

[22] Filed: Feb. 22, 1991

Related U.S. Application Data

[63] Continuation-in-part of Ser. No. 504,148, Apr. 3, 1990, and a continuation-in-part of Ser. No. 342,150, Apr. 24, 1989.

[51] Int. Cl.⁵ .............................................. C08K 5/54
[52] U.S. Cl. .................................. 427/387; 427/54.1; 524/266; 524/376; 524/588
[58] Field of Search ............... 522/77, 99; 427/54.1, 427/387; 524/266, 261, 588, 376

[56] References Cited

U.S. PATENT DOCUMENTS

| | | | |
|---|---|---|---|
| 3,706,695 | 12/1972 | Huebner et al. | 524/261 |
| 4,349,609 | 9/1982 | Takeda et al. | 428/429 |
| 4,600,685 | 7/1986 | Kitakohji et al. | 430/313 |
| 4,758,620 | 7/1988 | Whitwell et al. | 524/588 |
| 4,801,507 | 1/1989 | Estes et al. | 528/39 |
| 4,889,905 | 12/1989 | Suzuki | 522/99 |
| 4,904,721 | 2/1990 | Hanaoka et al. | 524/266 |
| 4,921,880 | 5/1990 | Lee et al. | 522/99 |

FOREIGN PATENT DOCUMENTS

| | | |
|---|---|---|
| 314313 | 5/1989 | European Pat. Off. . |
| 59-170110 | 9/1984 | Japan . |
| 63-270762 | 11/1988 | Japan . |
| 63-270774 | 11/1988 | Japan . |
| 01-165652 | 6/1989 | Japan . |
| 1156857 | of 0000 | U.S.S.R. . |

OTHER PUBLICATIONS

The Condensed Chemical Dictionary-9th Edition, Gessner Hawley, Editor, 773 (1977).
Hackh's Chemical Dictionary-pp. 610 and 611 (1969).

Primary Examiner—Veronica P. Hoke
Attorney, Agent, or Firm—Richard P. Fennelly; Louis A. Morris

[57] ABSTRACT

The hardness of coatings comprising a photocurable arylsiloxane oligomer or polymer and a liquid organosilicate can be dramatically improved by first curing the coating with ultraviolet light followed by heating.

10 Claims, No Drawings

HARDNESS IMPROVEMENT OF FILM CONTAINING ARYLSILOXANE AND ORGANOSILICATE

This is a continuation-in-part of U.S. Ser. No. 504,148, filed Apr. 3, 1990, and of U.S. Ser. No. 342,150, filed Apr, 24, 1989.

BACKGROUND OF THE INVENTION

Certain discoveries exist in the prior art in regard to the curing of certain types of polymers using ultraviolet radiation and heat. P. E. Wierenga et al., Applied Optics, Vol. 24, No. 7, April 1985, pp. 960–963 at page 961, indicates that the conversion of strongly cross-linked UV cured acrylate coatings depends on irradiation dose, on irradiation intensity, and "above all" on the curing temperature (citing J. G. Kloosterboer et al., Polymer Communications, 1984, Vol. 25, November, pp. 322–325).

Pending U.S. Ser. No. 504,148 teaches blends of photocurable arylsiloxane oligomers or polymers with organosilicates and that pending application is incorporated herein by reference in its entirety to illustrate such systems. That pending application does not discuss particular methods to improve the hardness of coatings comprising such oligomers or polymers.

DESCRIPTION OF THE INVENTION

It has now been found possible to dramatically increase the hardness of cured films comprising photopolymerizable arylsiloxane oligomers or polymers and organosilicates by first subjecting the films to ultraviolet curing followed by heat treatment at a sufficiently high temperature for a sufficient duration of time to achieve the desired degree of enhanced hardness.

The photocurable arylsiloxane oligomers or polymers which are useful herein are those known to the art and can be exemplified by the types of materials described in cross-referenced U.S. Ser. No. 504,148, which is incorporated herein for such disclosure. One commercially available material of this type of material is WACKER SILICONE INTERMEDIATE SY 430 which is a silanol-functional (hydroxy-functional) phenyl silicone resin having a minimum silicone content of 98% and a hydroxy content of no less than about 5%. It has an average molecular weight of about 1700 g/mol.

The organosilicate which forms the other essential component of the film composition to be treated by the present invention is of the formula

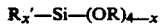

$$R_x{'}-Si-(OR)_{4-x}$$

where R' can be phenyl, vinyl, or alkyl, x can be from 0 to 4, and R is lower alkyl. Tetraalkylsilicates containing from 1 to 4 carbon atoms, such as tetraethylorthosilicate, are preferred. The weight ratio of arylsiloxane to organosilicate can range from about 10:1 to about 1.5:1.

A solvent for use in depositing a coating of the foregoing arylsiloxane and silicate-containing composition is an optional feature of the present invention. One type of solvent which can be used are the alkoxyalcohols, such as those described in U.S. Ser. No. 342,150, filed Apr. 24, 1989, having the formula ROR'OH, where R is $C_1$ to $C_4$ alkyl and R' is $C_2$ to $C_3$ alkylene. It is present in major amount based on the weight of the entire coating composition with the amount of solvent being from about 5:1 to about 1.5:1, on a weight basis, in most cases, compared to the amount of siloxane and silicate.

The ultraviolet curing step can be achieved in about one hour at a wavelength of about 254 nm, if desired. As illustrated in the Examples given below, use of just ultraviolet curing does not result in a dramatic increase in the hardness of films of the above type.

Following the ultraviolet light curing step, this invention relies upon heating the light cured film to a sufficiently high temperature for a sufficient length of time to achieve the concomitant increase in hardness. For example, heating for sixteen hours at 400° C. is effective. The use of higher temperatures and shorter times or lower temperatures with longer times is deemed to be within the scope of the invention. Suitable variations in both of these directions is well within the skill of the person in the art to achieve the degree of hardness enhancement desired.

The invention is further illustrated by the Examples which follow.

EXAMPLES 1-11

A solution (total solids = 35 wt%) comprising 110 gm of 1-methoxy-2-propanol, 60 gm of silanol-functional phenyl silicone resin (WACKER SY 430 brand), and 10 gm of tetraethylorthosilicate was spun coated onto silicon wafers (7.62 cm diameter) at 2000 rpm for 60 seconds.

After coating, the film was then treated to one of the following two procedures:

A. (UV Light Treatment Before Heating)—the film was promptly treated after its formation to ultraviolet (UV) light at 254 nm, 6.7 watts/cm$^2$, for one hour, followed by heat treatment as indicated in more detail below.

B. (Heating Before UV Light Treatment)—the film was promptly heated as described in greater detail below and then treated to ultraviolet light as described in A, above.

Hardness was measured using a NANO INDENTER II mechanical properties microprobe from Nano Instruments Inc., Knoxville, Tenn. which is more fully described in U.S. Pat. No. 4,848,141. For the films treated under procedure A, above, the loading was at a constant 20 nm/sec displacement rate up to 1 μm (maximum load = 20 mN) and unloading was at a constant displacement rate until 10% load was left on the sample. The films treated under procedure B were treated to a 25 nm/sec displacement during loading up to a 2 μm depth with all other parameters being the same as for A.

The results obtained were:

| Ex. No. | Treatment | Temperature[1] (°C.) | Hardness[2] (GPa) | Relative Hardness[3] |
|---|---|---|---|---|
| 1 | — | None | 0.10 | — |
| 2 | (4) | None | 0.10 | 0.88 |
| 3 | None | 270°[5] | 0.20 | 1.0 |
| 4 | A | 270° | 0.30 | 1.6 |
| 5 | B | 270° | 0.28 | 1.9 |
| 6 | None | 330°[5] | 0.18 | 1.0 |
| 7 | A | 330° | 0.28 | 1.3 |
| 8 | B | 330° | 0.24 | 1.4 |
| 9 | None | 400°[5] | 0.21 | 1.4 |
| 10* | A | 400° | 9.20 | 112.5 |

-continued

| Ex. No. | Treatment | Temperature[1] (°C.) | Hardness[2] (GPa) | Relative Hardness[3] |
|---------|-----------|----------------------|-------------------|----------------------|
| 11      | B         | 400°                 | 0.32              | 1.8                  |

[1] in all cases where heating was present, the heating time was sixteen hours.
[2] the hardness value was taken at the 1000 nm depth.
[3] relative hardness at 250 nm depth was determined by dividing the hardness of the sample at that depth for each of the samples of Examples 2-11 and dividing it by the hardness at the same depth for the uncured sample which did not have either ultraviolet light treatment or heat treatment.
[4] this sample only had ultraviolet light treatment for one hour.
[5] this sample only had heat treatment.
*in accordance with the invention.

In the data presented above, Examples 2-9 and 11 which show use of differing procedures, not in accordance with the present invention, at temperatures of 270°, 330°, and 400° C. fail to show other than a small effect of ultraviolet light and/or heating as compared to Example 1 which is presented for control purposes to show no ultraviolet and no heat treatment. The run in example 10 which utilizes a sufficiently high temperature with a pretreatment with ultraviolet light shows a dramatic increase in hardness.

EXAMPLE 12

The following relative hardness data were generated at various depths profiled in the sample of Examples 2 (UV only), 9 (400° C. heat only), 10 (UV then 400° C. heat), and 11 (400° C. heat then UV), above.

| Sample From Ex. No. | Depth (nm) | Relative Hardness |
|---------------------|------------|-------------------|
| 2                   | 25         | 0.67              |
|                     | 100        | 1.25              |
|                     | 250        | 0.88              |
| 9                   | 25         | 1.9               |
|                     | 100        | 1.5               |
|                     | 250        | 1.4               |
| 10*                 | 25         | 85.7              |
|                     | 100        | 112.5             |
|                     | 250        | 112.5             |
| 11                  | 25         | 2.9               |
|                     | 100        | 2.0               |
|                     | 250        | 1.8               |

*in accordance with the invention.

The foregoing Examples illustrate only certain preferred embodiments of the present invention and should, for that reason, not be taken in a limiting sense. The scope of protection sought is set forth in the claims which follow.

We claim:

1. A process for the enhancement of the hardness of a coating comprising a tetraorganosilicate and a photocurable arylsiloxane oligomer or polymer which comprises first subjecting the coating to curing with ultraviolet light followed by heating.

2. A process as claimed in claim 1 wherein the arylsiloxane is a silanol-functional arylsiloxane.

3. A process as claimed in claim 1 wherein the silicate is a tetraalkylorthosilicate.

4. A process as claimed in claim 2 wherein the silicate is a tetraalkylorthosilicate.

5. A process as claimed in claim 1 wherein the coating also comprises an alkoxyalcohol solvent.

6. A process as claimed in claim 2 wherein the coating also comprises an alkoxyalcohol solvent.

7. A process as claimed in claim 3 wherein the coating also comprises an alkoxyalcohol solvent.

8. A process as claimed in claim 4 wherein the coating also comprises an alkoxyalcohol solvent.

9. A process as claimed in claim 2 wherein the silicate is tetraethylsilicate.

10. A process as claimed in claim 9 wherein the coating also comprises an alkoxyalcohol solvent.

* * * * *